United States Patent
Yoshimi et al.

(10) Patent No.: US 8,691,613 B2
(45) Date of Patent: Apr. 8, 2014

(54) METHOD FOR MANUFACTURING PHOTOELECTRIC CONVERSION DEVICE

(75) Inventors: Masashi Yoshimi, Settsu (JP); Mitsuru Ichikawa, Settsu (JP); Toshihiko Uto, Settsu (JP); Kenji Yamamoto, Settsu (JP)

(73) Assignee: Kaneka Corporation, Osaka (JP)

( * ) Notice: Subject to any disclaimer, the term of this patent is extended or adjusted under 35 U.S.C. 154(b) by 0 days.

(21) Appl. No.: 13/877,148

(22) PCT Filed: Aug. 31, 2011

(86) PCT No.: PCT/JP2011/069811
§ 371 (c)(1),
(2), (4) Date: Mar. 29, 2013

(87) PCT Pub. No.: WO2012/043124
PCT Pub. Date: Apr. 5, 2012

(65) Prior Publication Data
US 2013/0210185 A1    Aug. 15, 2013

(30) Foreign Application Priority Data
Oct. 1, 2010   (JP) ................................. 2010-224118

(51) Int. Cl.
*H01L 21/00* (2006.01)
(52) U.S. Cl.
USPC .................. 438/56; 438/57; 438/61; 438/72; 257/E31.127; 257/E31.043; 257/E31.124
(58) Field of Classification Search
USPC ........................... 438/57, 61, 72, 96–98, 942; 257/E31.127, E31.043, E31.124; 136/256
See application file for complete search history.

(56) References Cited

U.S. PATENT DOCUMENTS

| 4,968,384 A | 11/1990 | Asano |
| 2004/0182433 A1 | 9/2004 | Terakawa et al. |

FOREIGN PATENT DOCUMENTS

| JP | 5136440 A | 6/1993 |
| JP | 6196729 A | 7/1994 |
| JP | 6105691 B2 | 12/1994 |
| JP | 9082996 A | 3/1997 |
| JP | H0982996 A | 3/1997 |
| JP | 10135497 A | 5/1998 |
| JP | H10135497 A | 5/1998 |
| JP | 2003303984 A | 10/2003 |
| JP | 4171428 B2 | 8/2008 |

OTHER PUBLICATIONS

ISA Japan, International Search Report of PCT/JP2011/069811, Oct. 11, 2011, WIPO, 4 pages.
The International Bureau of WIPO, International Preliminary Report on Patentability of PCT/JP2011/069811, Switzerland, Apr. 11, 2013, 6 pages.

*Primary Examiner* — Evan Pert
(74) *Attorney, Agent, or Firm* — Alleman Hall McCoy Russell & Tuttle LLP (57) ABSTRACT

A crystalline-based silicon photoelectric conversion device comprises: an intrinsic silicon-based layer and a silicon-based layer of a first conductivity type, on one surface of a single-crystal silicon substrate of the first conductivity type; and an intrinsic silicon-based and a silicon-based layer of an opposite conductivity type, in this order on the other surface of the silicon substrate. At least one of forming the intrinsic silicon-based layer of the first conductivity type layer-side forming the intrinsic silicon-based layer of the opposite conductivity type layer-side includes: forming a first intrinsic silicon-based thin-film layer having a thickness of 1-10 nm on the silicon substrate; plasma-treating the silicon substrate in a gas containing mainly hydrogen; and forming a second intrinsic silicon-based thin-film layer on the first intrinsic silicon-based thin-film.

4 Claims, 1 Drawing Sheet

METHOD FOR MANUFACTURING PHOTOELECTRIC CONVERSION DEVICE

TECHNICAL FIELD

The invention relates to a method for manufacturing a crystalline silicon-based photoelectric conversion device having a heterojunction on a single-crystal silicon substrate surface.

BACKGROUND ART

Crystalline silicon-based solar cells using crystalline silicon substrates are high in photoelectric conversion efficiency, and thus have been widely and generally used in solar power generation systems. Among them, a crystalline silicon-based solar cell in which a conductive amorphous silicon-based thin-film having a band gap different from that of a single-crystal silicon is formed on a surface of the crystal silicon substrate is called a heterojunction solar cell.

Among heterojunction solar cells, a solar cell having an intrinsic amorphous silicon thin-film between a conductive amorphous silicon-based thin-film and a crystal silicon substrate is one embodiment of a crystalline silicon-based solar cell with a high conversion efficiency. By forming an intrinsic amorphous silicon thin-film between a single-crystal silicon substrate and a conductive amorphous silicon-based thin-film, generation of defect levels by formation of the conductivity-type amorphous silicon-based layer can be reduced and defects present on the surface of single-crystal silicon (principally dangling bonds of silicon) can be terminated (passivated) with hydrogen. In addition, due to a presence of an intrinsic amorphous silicon thin-film, carrier-introduction impurities can be prevented from diffusing to the surface of single-crystal silicon at the time of forming a conductive amorphous silicon-based thin-film.

As an attempt to enhance the conversion efficiency of aforementioned heterojunction solar cell, Patent Document 1 proposes that before an intrinsic amorphous silicon-based layer is formed on a crystalline silicon substrate, the crystalline silicon substrate surface is subjected to a hydrogen plasma treatment to clean the substrate surface.

Patent Document 2 proposes that a hydrogen concentration profile in an amorphous silicon-based layer is controlled by changing the hydrogen dilution ratio in multiple stages during formation of the amorphous silicon-based layer. Patent Document 2 describes that by controlling the hydrogen concentration profile, the dangling bond of silicon in the film is terminated, so that carrier recombination is suppressed, leading to enhancement of the conversion characteristics. As a technique related to a thin-film silicon-based photoelectric conversion device, Patent Document 3 proposes that formation of an amorphous silicon-based thin-film having a thickness of less than 1 nm and a hydrogen plasma treatment are repeatedly carried out. The method of repeating deposition and a hydrogen plasma treatment in this way is also referred to as "chemical annealing". By chemical annealing, defects in the amorphous silicon-based layer are reduced.

PRIOR ART DOCUMENTS

Patent Documents

Patent Document 1: JP-2841335
Patent Document 2: JP-4171428
Patent Document 3: JP-B-6-105691

SUMMARY OF THE INVENTION

Problems to be Solved by the Invention

The inventors made an attempt to improve the photoelectric conversion characteristics by a method of plasma-treating a silicon substrate surface as described in Patent Document 1, but sufficient enhancement of the characteristics could not be achieved. This is because although an effect of cleaning a crystalline silicon substrate surface is achieved by a hydrogen plasma treatment, the substrate surface suffers plasma damage, and resultantly defects at the interface between the crystalline silicon substrate and an intrinsic amorphous silicon-based layer are not reduced.

In the method described in Patent Document 2, film quality of a silicon-based thin-film itself is improved, but it is difficult to reduce defects at the interface between a crystalline silicon substrate and an intrinsic amorphous silicon-based layer. Furthermore, the hydrogen concentration profile in the film is strongly affected by other step conditions such as temperature history in addition to the hydrogen dilution ratio during deposition. Thus, there is a problem that it is difficult to stably control the hydrogen concentration profile to enhance the conversion characteristics.

By chemical annealing as described in Patent Document 3, film quality of a silicon-based thin-film can be improved. However, film quality is improved by chemical annealing only over a range of less than 1 nm from the treated surface. On the other hand, in a heterojunction solar cell, the thickness of an intrinsic amorphous silicon-based layer is required to be at least about 3 nm for preventing diffusion of a conductivity-type impurity to a silicon substrate surface and exhibiting a passivation effect on defects. Therefore, there is a problem that for improving film quality of the intrinsic amorphous silicon-based layer by chemical annealing, it is necessary to repeat deposition and a hydrogen plasma treatment many times, leading to poor productivity.

In view of the above, an object of the present invention is to enhance the photoelectric conversion characteristics by reducing defects at the interface between a single-crystal silicon substrate and a silicon-based thin-film layer in a crystalline silicon-based photoelectric conversion device.

Means for Solving the Problems

As a result of conducting studies in view of the above-mentioned problems, it has found that the photoelectric conversion characteristics can be enhanced by improving a method for forming an intrinsic amorphous silicon-based layer in a method for manufacturing a crystalline silicon-based photoelectric conversion device.

The present invention relates to a method for manufacturing a crystalline silicon-based photoelectric conversion device which includes an intrinsic silicon-based layer of a first conductivity type layer-side and a silicon-based layer of a first conductivity type formed in this order on one surface of a single-crystal silicon substrate of the first conductivity type; and an intrinsic silicon-based layer of an opposite conductivity type layer-side and a silicon-based layer of an opposite conductivity type in this order on the other surface of the single-crystal silicon substrate of the first conductivity type. At least one of a step of forming the intrinsic silicon-based layer of the first conductivity type layer-side and a step of forming the intrinsic silicon-based layer of the opposite conductivity type layer-side preferably includes the following first intrinsic silicon-based thin-film layer forming step, plasma treatment step and second intrinsic silicon-based thin-film layer forming step in this order.

The first intrinsic silicon-based thin-film layer forming step comprises a step of forming a first intrinsic silicon-based thin-film layer having a thickness of 1 nm to 10 nm on the single-crystal silicon substrate of the first conductivity type.

The plasma treatment step comprises a step of plasma-treating the single-crystal silicon substrate of the first conductivity type, on which the first intrinsic silicon-based thin-film layer is formed, in an atmosphere of a gas containing hydrogen as a main component.

The second intrinsic silicon-based thin-film layer forming step comprises a step of forming a second intrinsic silicon-based thin-film layer on the first intrinsic silicon-based thin-film layer.

In the present invention, the sum of the thickness of the first intrinsic silicon-based thin-film layer and the thickness of the second intrinsic silicon-based thin-film layer is preferably 16 nm or less.

In one embodiment of the present invention, after the first intrinsic silicon-based thin-film layer forming step, plasma discharge is temporarily stopped, and thereafter plasma discharge is resumed to carry out the plasma treatment step.

Effects of the Invention

According to the manufacturing method of the present invention, the passivation effect on a single-crystal silicon substrate of a crystalline silicon-based photoelectric conversion device is enhanced, so that defects at the interface between the single-crystal silicon substrate and a silicon-based thin-film layer can be reduced. Therefore, a crystalline silicon-based photoelectric conversion device excellent in photoelectric conversion efficiency can be provided.

DESCRIPTION OF EMBODIMENTS

An embodiment of the present invention will be described below with reference of the schematic sectional view of a crystalline silicon-based photoelectric conversion device shown in FIG. 1. In the crystalline silicon-based photoelectric conversion device in FIG. 1, an intrinsic silicon-based layer 2 is formed on one surface of a single-crystal silicon substrate 1 of a first conductivity type, and an intrinsic silicon-based layer 4 is formed on the other surface thereof. A silicon-based layer 3 of the first conductivity type and a silicon-based layer 5 of an opposite conductivity type are formed on the surfaces of the intrinsic silicon-based layer 2 and the intrinsic silicon-based layer 4, respectively. Hereinafter, the intrinsic silicon-based layer 2 between the single-crystal silicon substrate 1 of the first conductivity type and the silicon-based layer 3 of the first conductivity type may be referred to as a "intrinsic silicon-based layer of the first conductivity type layer-side", and the intrinsic silicon-based layer 4 between the single-crystal silicon substrate 1 of the first conductivity type and the silicon-based layer 5 of the opposite conductivity type may be referred to as a "intrinsic silicon-based layer of the opposite conductivity type layer-side". Generally, transparent electrode layers 6 and 8 are formed on the surfaces of the silicon-based layer 3 of the first conductivity type and the silicon-based layer 5 of the opposite conductivity type, and collecting electrodes 7 and 9 are formed thereon, respectively.

First, the conductive single-crystal silicon substrate 1 will be described. Generally, a single-crystal silicon substrate contains an impurity that supplies charges to silicon, and is conductive. The conductive single-crystal silicon substrates containing an impurity include an n-type single-crystal silicon substrate containing an impurity that introduces electrons to Si atoms (e.g. phosphorus atoms), and a p-type single-crystal silicon substrate containing an impurity that introduces holes to Si atoms (e.g. boron atoms). In this specification, "first conductivity type" refers to either an n-type or a p-type.

When the single-crystal silicon substrate of the first conductivity type is used as material for a solar cell, a heterojunction on the light incident side where light incident to the single-crystal silicon substrate is most absorbed is preferably a reverse junction. When the heterojunction on the light incident side is a reverse junction, a strong electric field is provided, so that electron/hole pairs are effectively separated and collected. When comparing the hole and the electron, the electron, which has a lower effective mass and scattering cross-sectional area, generally has a high mobility. Accordingly, the single-crystal silicon substrate 1 of the first conductivity type used in the present invention is preferably an n-type single-crystal silicon substrate.

An example of the structure of the crystalline silicon-based photoelectric conversion device, when an n-type single-crystal silicon substrate is used as described above, is a structure including a collecting electrode 9/a transparent electrode layer 8/a p-type amorphous silicon-based layer 5/a non-doped amorphous silicon-based layer 4/an n-type single-crystal silicon substrate 1/a non-doped amorphous silicon-based layer 2/an-n-type amorphous silicon-based layer 3/a transparent electrode layer 6/a collecting electrode 7, in this order. In this configuration, the n-type amorphous silicon-based layer (also referred to as an n layer) side is preferably a back side.

On the other hand, an example of the structure of the crystalline silicon-based photoelectric conversion device, when a p-type single-crystal silicon substrate is used as the conductive single-crystal silicon substrate, is a structure including a collecting electrode 9/a transparent electrode layer 8/an n-type amorphous silicon-based layer 5/a non-doped amorphous silicon-based layer 4/a p-type single-crystal silicon substrate 1/a non-doped amorphous silicon-based layer 2/a p-type amorphous silicon-based layer 3/a transparent electrode layer 6/a collecting electrode 7, in this order. In this case, the p-layer side is preferably the incident surface side, with the reverse junction part being the light incident side, from the viewpoint of increasing carrier collection efficiency.

From a viewpoint of light confinement, a texture (uneven structure) is preferably formed on a surface of the single-crystal silicon substrate. The single-crystal silicon substrate is preferably cut out such that the light-incidence plane is identical to the (100) plane in order to form a texture on its surface. This is because when the single-crystal silicon substrate is etched, a textured surface structure is easily formed by anisotropic etching that exploits the difference in etching rate between the (100) plane and the (111) plane.

The intrinsic silicon-based layer 2 of the first conductivity type layer-side and the silicon-based layer 3 of the first conductivity type are formed on one surface of the single-crystal silicon substrate 1, and the intrinsic silicon-based layer 4 of the opposite conductivity type layer-side and the silicon-based layer 5 of the opposite conductivity type are formed on the other surface thereof. The method for forming these silicon-based layers is not particularly limited, but a plasma-enhanced CVD method is preferably used. When the silicon-based layer is formed by the plasma-enhanced CVD method, formation of the silicon-based layer and the hydrogen plasma treatment described later can be performed in the same chamber, and therefore the production process can be simplified. Conditions used for forming the silicon-based thin-films are preferably, for example, as follows: a substrate temperature of 100 to 300° C.; a pressure of 20 to 2600 Pa; and a high-frequency power density of 0.003 to 0.5 W/cm$^2$. A source gas used to form the silicon-based thin-films may be a silicon-containing gas such as $SiH_4$ or $Si_2H_6$. A source gas diluted with, for example, $H_2$ may be introduced to a chamber. A dopant gas for forming the conductive (p-type or n-type) silicon-based layer is preferably, for example, $B_2H_6$ or $PH_3$. The amount of impurity such as P or B added, in this case, is sufficient to be a trace amount; thus, a mixed gas wherein $B_2H_6$ or $PH_3$ is beforehand diluted with the source gas, $H_2$ or the like may be used. A gas containing a different element, such as $CH_4$, $CO_2$, $NH_3$ or $GeH_4$, may be added to the aforementioned gas to form a silicon alloy layer, such as silicon carbide, silicon nitride and silicon germanium, as the silicon-based layer.

The intrinsic silicon-based thin-films 2 and 4 are non-doped silicon-based thin-films of substantially intrinsic silicon. The intrinsic silicon-based layers 2 and 4 are preferably non-doped hydrogenated amorphous silicon consisting essentially of silicon and hydrogen. When intrinsic silicon-based layers 2 and 4 are formed on each surface of the single-crystal silicon substrate, surface passivation can be effectively performed while suppressing diffusion of impurities to the single-crystal silicon substrate.

In the manufacturing method of the present invention, it is preferable that formation of the intrinsic silicon-based layer is temporarily stopped midstream, and a plasma treatment be carried out in an atmosphere of a gas containing hydrogen as a main component, followed by resuming deposition. A method for forming an intrinsic silicon-based layer in the present invention will be described below with the intrinsic silicon-based layer 2 of the first conductivity type layer-side as an example.

First, the single-crystal silicon substrate 1 of the first conductivity type is placed in a vacuum chamber of a plasma-enhanced CVD device, and thereafter the substrate is heated for a certain period as necessary. Thereafter, a first intrinsic silicon-based thin-film layer 21 is formed. The first intrinsic silicon-based thin-film layer has a role as a protective layer for reducing plasma damage to the single-crystal silicon surface at the time of the hydrogen plasma treatment.

The first intrinsic silicon-based thin-film layer 21 is preferably formed with a thickness of 1 nm to 10 nm. The thickness of the first intrinsic silicon-based thin-film layer is more preferably 2 nm or more. If the thickness of the first intrinsic silicon-based thin-film layer is too small, surface coverage of the single-crystal silicon substrate may be insufficient, so that the single-crystal silicon surface tends to suffer plasma damage easily during the hydrogen plasma treatment. In particular, when a texture is formed on the single-crystal silicon substrate surface, coverage of the bottom and top of the texture tends to be insufficient if the thickness of the first intrinsic silicon-based thin-film layer is small. Therefore, when a texture is formed on the single-crystal silicon substrate 1 surface, the first intrinsic silicon-based thin-film layer 21 is formed preferably with a thickness of 1.5 nm or more, preferably with a thickness of 2 nm or more. The thickness of the first intrinsic silicon-based thin-film layer is more preferably 8 nm or less, further preferably 6 nm or less, particularly preferably 5 nm or less, most preferably 4 nm or less. If the thickness of the first intrinsic silicon-based thin-film layer is too large, the passivation effect on the single-crystal silicon substrate by a hydrogen plasma treatment and the effect of reducing defects at the interface between the single-crystal silicon substrate and the first intrinsic silicon-based thin-film layer may not be sufficiently obtained.

After formation of the first intrinsic silicon-based thin-film layer 21, a plasma treatment is carried out in an atmosphere of a gas containing hydrogen as a main component. After formation of the first intrinsic silicon-based thin-film layer, the surface thereof is subjected to a hydrogen plasma treatment in this way, so that the conversion characteristics, particularly the open circuit voltage (Voc), of the crystalline silicon-based photoelectric conversion device may be improved. This is considered to be because the hydrogen passivation effect on the single-crystal silicon substrate, which is insufficient only by forming a silicon-based thin-film layer thereon, is improved. As a result of studies conducted by the inventors, it has been found that the conversion characteristics of the crystalline silicon-based photoelectric conversion device may be improved when a hydrogen plasma treatment is carried out after formation of the first intrinsic silicon-based thin-film layer as compared to when the single-crystal silicon substrate surface is subjected to a hydrogen plasma treatment directly. This is considered to be because the first intrinsic silicon-based thin-film layer acts as a protective layer for reducing plasma damage to the single-crystal silicon surface during the hydrogen plasma treatment.

As conditions for the plasma treatment, it is preferable that, for example, the substrate temperature be 100° C. to 300° C., and the pressure be 20 Pa to 2600 Pa. The high-frequency power density and plasma treatment period in the plasma treatment step can be appropriately set within the range of obtaining the effect of the invention. However, even when the first intrinsic silicon-based thin-film layer is provided on the single-crystal silicon substrate, impacts of plasma damage on the single-crystal silicon substrate surface may increase, leading to a degradation in photoelectric conversion characteristic, if the high-frequency power density during the plasma treatment is excessively high, or the plasma treatment period is excessively long. Therefore, the high-frequency power density during the plasma treatment is preferably 0.052 W/cm$^2$ or less, more preferably 0.039 W/cm$^2$ or less. The plasma treatment period is preferably 140 seconds or less, more preferably 120 seconds or less.

The lower limit of the high-frequency power density during the plasma treatment is not particularly limited as long as hydrogen plasma can be generated. The high-frequency power density in the plasma treatment step is preferably 0.01 W/cm$^2$ or more, more preferably 0.016 W/cm$^2$ or more from the viewpoint of enhancing hydrogen passivation and reducing defects from the hydrogen plasma treatment.

The lower limit of the plasma treatment period is not particularly limited, and is appropriately set in consideration of the thickness of the first intrinsic silicon-based thin-film layer and the high-frequency power density in the plasma treatment step. The plasma treatment period is preferably 3 seconds or more, more preferably 10 seconds or more from the viewpoint of improving the hydrogen passivation effect on the crystalline silicon substrate.

The "atmosphere of a gas containing hydrogen as a main component" in the plasma treatment step may contain an inert gas such as nitrogen, helium or argon, and may contain a very small amount of a dopant gas such as $B_2H_6$ or $PH_3$, as long as the concentration of hydrogen in the atmosphere is 70% by volume or more. On the other hand, in the plasma treatment step, preferably a raw material gas such as $SiH_4$ is not introduced in the chamber and a raw material gas used for forming the first intrinsic silicon-based thin-film layer does not remain in the chamber. Even if the raw material gas is contained in the gas atmosphere in the plasma treatment step, the silicon-based layer is preferably not substantially formed during plasma discharge. The acceptable limit of the content of the raw material gas in the plasma treatment step depends on other deposition parameters, but is preferably $1/100$ or less, more preferably $1/500$ or less, further preferably $1/2000$ or less of the content of hydrogen on a volume basis.

The intrinsic silicon-based layer 2 is preferably non-doped hydrogenated amorphous silicon as described previously, but according to the manufacturing method of the present invention, a part of the first intrinsic silicon-based thin-film layer may be crystallized by the hydrogen plasma treatment even when amorphous silicon is deposited as the first intrinsic silicon-based thin-film layer 21. Presence of a crystallized component can be confirmed by, for example, cross-sectional observation of a sample with a high-resolution transmission electron microscope (TEM), X-ray diffractometry, Raman scattering spectroscopy or the like.

After the plasma treatment step, a second intrinsic silicon-based thin-film layer 22 is formed on the first intrinsic silicon-based thin-film layer 21. In the present invention, the second intrinsic silicon-based thin-film layer 22 is formed after the hydrogen plasma treatment, so that the total thickness of the intrinsic silicon-based layer 2 increases. Consequently, atomic impurities are inhibited from diffusing to the single-crystal silicon substrate 1 during formation of the conductive silicon-based layer 3.

The second intrinsic silicon-based thin-film layer 22 is preferably formed with a thickness of 1 nm to 15 nm. The thickness of the second intrinsic silicon-based thin-film layer is preferably 2 nm to 14 nm, more preferably 2.5 nm to 12 nm, further preferably 3 nm to 10 nm. The sum of the thickness of the first intrinsic silicon-based thin-film layer 21 and the thickness of the second intrinsic silicon-based thin-film layer 22, i.e. the thickness of the intrinsic silicon-based layer 2, is preferably 6 nm or more. If the thickness of the intrinsic silicon-based layer 2 is excessively small, interface defects tends to be increased due to diffusion of atomic impurities in the conductive silicon-based layer 3 to the single-crystal silicon substrate surface or deterioration of surface coverage of the single-crystal silicon substrate. On the other hand, if the thickness of the intrinsic silicon-based layer 2 is excessively large, the conversion characteristic may be degraded due to an increase in resistance or an increase in loss of light by absorption. Therefore, the thickness of the intrinsic silicon-based layer 2 is preferably 16 nm or less. The thickness of the intrinsic silicon-based layer is more preferably 3 nm to 14 nm, further preferably 5 nm to 12 nm.

The above-mentioned first intrinsic silicon-based thin-film layer forming step, plasma treatment step, and second intrinsic silicon-based thin-film layer forming step are preferably carried out successively in the same deposition chamber. Plasma discharge is preferably stopped temporarily after the first intrinsic silicon-based thin-film layer forming step and before starting of the plasma treatment step. That is, it is preferable that after supply of a raw material gas is stopped, plasma discharge is stopped, so that the inside of the chamber is under an atmosphere of a gas containing hydrogen as a main component, and discharge can be resumed to start the plasma treatment step. If the plasma treatment step is successively carried out, after formation of the first intrinsic silicon-based thin-film layer without stopping plasma discharge, an interface layer having a relatively high hydrogen concentration may be formed between the first intrinsic silicon-based thin-film layer and the second intrinsic silicon-based thin-film layer owing to the raw material gas remaining in the chamber. The interface layer may cause the conversion characteristics to be degraded. Thus, it is preferable that the raw material gas be discharged to outside the chamber in a short time in order to replace the atmospheric gas by a method of increasing a flow rate of hydrogen gas temporarily after formation of the first intrinsic silicon-based thin-film layer, or the like, if plasma discharge is not stopped before the plasma treatment step is started.

The step of forming the intrinsic silicon-based layer has been described above with the intrinsic silicon-based layer 2 of the first conductivity type layer-side as an example, but in the manufacturing method of the present invention, it suffices that any one of formation of the intrinsic silicon-based layer 2 of the first conductivity type layer-side and formation of the intrinsic silicon-based layer 4 of the opposite conductivity type layer-side includes three steps, i.e. the first intrinsic silicon-based thin-film layer forming step, the plasma treatment step and the second intrinsic silicon-based thin-film layer forming step. When both the step of forming the intrinsic silicon-based layer 2 of the first conductivity type layer-side and the step of forming the intrinsic silicon-based layer 4 of the opposite conductivity type layer-side include the above-mentioned three steps, an effect of further improving the conversion characteristics may be obtained.

The method for forming the conductive silicon-based layers 3 and 5 on the intrinsic silicon-based layers 2 and 4 is not particularly limited. As the conductive silicon-based layer, a hydrogenated amorphous silicon layer, an oxidized amorphous silicon layer, an amorphous silicon carbide layer or the like is formed. In addition to an amorphous layer, a microcrystalline layer that partially contains a crystalline component may be formed.

The transparent electrode layers 6 and 8 are formed on the conductive silicon-based layers 3 and 5. The transparent electrode layer contains a conductive oxide. As the conductive oxide, for example, zinc oxide, indium oxide and tin oxide can be used alone or in combination. Further, an electroconductive dopant may be added to these conductive oxides. Examples of the dopant added to zinc oxide include aluminum, gallium, boron, silicon and carbon. Examples of the dopant added to indium oxide include zinc, tin, titanium, tungsten, molybdenum and silicon. Examples of the dopant added to tin oxide include fluorine. These conductive oxides may be deposited as a single film, or deposited as a stack of films.

The thickness of the transparent electrode layer is preferably 10 nm or more and 140 nm or less from the viewpoints of transparency and electroconductivity. It suffices that the transparent electrode layer has electroconductivity required for transportation of a carrier to the collecting electrode. If the thickness of the transparent electrode layer is too large, the transmittance may be reduced due to the absorption losses of the transparent electrode layer itself, thus causing degradation of photoelectric conversion efficiency.

As the method for forming the transparent electrode layer, a physical vapor deposition method such as a sputtering method, chemical vapor deposition (MOCVD) using a reaction of an organic metal compound with oxygen or water, or the like is preferable. In any deposition method, energy from heat, plasma discharge or the like may be used for deposition.

The collecting electrodes 7 and 9 are formed on the transparent electrode layers 6 and 8. The collecting electrode can be prepared by a known technique such as inkjet printing, screen printing, wire bonding or spraying. A screen printing is preferable from the viewpoint of productivity. In the screen printing method, a step of printing an electroconductive paste formed of metallic particles and a resin binder by screen printing is suitably used.

The photoelectric conversion device obtained by the manufacturing method of the present invention can be found to have several differences in terms of properties as compared to a photoelectric conversion device manufactured by a conventional method. For example, the photoelectric conversion device obtained by the manufacturing method of the present invention tends to have a long carrier lifetime. This is because the hydrogen passivation effect on the single-crystal silicon substrate surface is enhanced, so that defects at the interface between the single-crystal silicon substrate and the intrinsic silicon-based layer are reduced, leading to a decrease in carrier recombination rate at the interface. The carrier lifetime can be measured by a μ-PCD method, a QSSPC (Quasi Steady State Photoconductivity) method, or the like.

EXAMPLES

Examples of the present invention will be specifically described below, but the present invention is not limited to the Examples below.

[Measurement Method]

A thickness was determined by transmission electron microscope (TEM) observation of cross section. It is difficult to identify the interface between a first intrinsic silicon-based thin-film layer and a second intrinsic silicon-based thin-film layer, and the interface between the second intrinsic silicon-based thin-film layer and a conductive silicon layer by TEM observation. Thus, the thickness of each of these layers was calculated from a ratio of the total thickness of the layers determined from TEM observation and the deposition period. For a layer formed on a textured silicon substrate surface, a direction perpendicular to the slope of the texture was determined to be a thickness direction.

The output characteristics of a photoelectric conversion device were measured at a sample temperature of 25° C. under irradiation of light of AM 1.5 in an amount of 100 mW/cm$^2$.

The measurement of a carrier lifetime was performed by a μ-PCD method (WT-2000, manufactured by Semilab Japan K.K.) using a sample with non-doped amorphous silicon layers 2 and 4 and also conductive amorphous silicon layers 3 and 5 formed on a single-crystal silicon substrate 1.

Example 1

Figure 1:
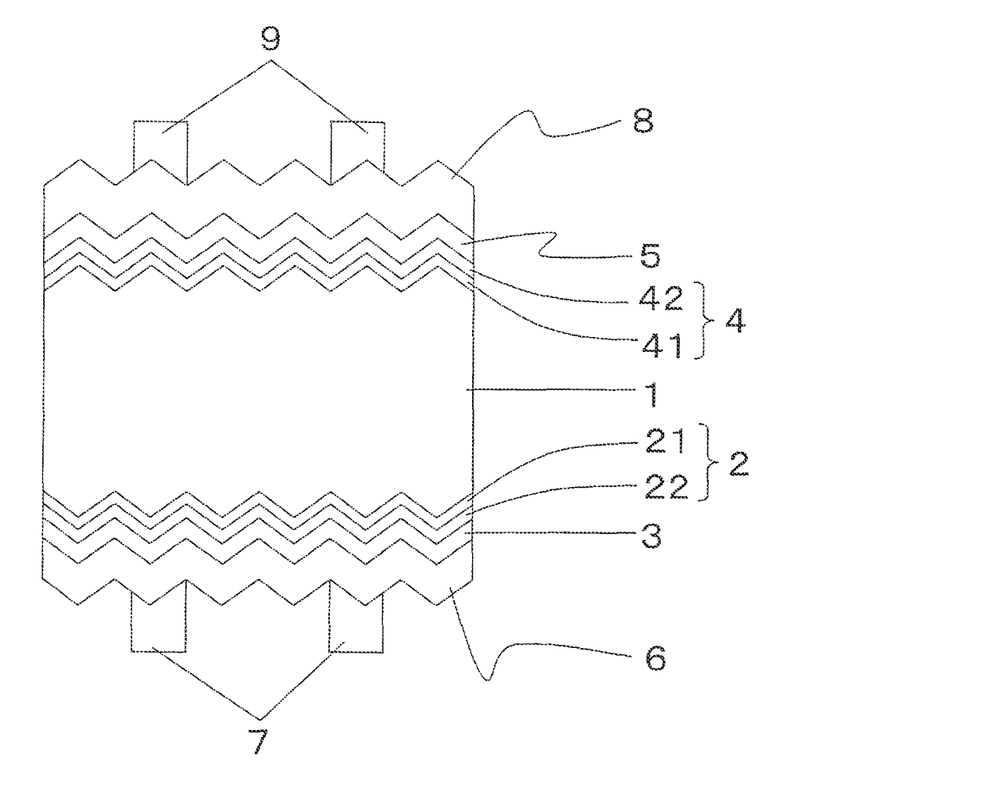
FIG. 1 is a schematic sectional view of a crystalline silicon-based photoelectric conversion device according to one embodiment of the present invention.

In Example 1, a crystalline silicon-based solar cell schematically shown in FIG. 1 was prepared.

An n-type single-crystal silicon substrate having a light incident surface direction identical to (100) and having a thickness of 200 μm was washed in acetone. Thereafter, the substrate was immersed in an aqueous HF solution with a concentration of 2% by weight for 3 minutes to remove a silicon oxide covering on the surface, and rinsed twice with ultrapure water. The silicon substrate was immersed in 5/15 wt % aqueous KOH/isopropyl alcohol solution held at 70° C. for 15 minutes, and the surface of the substrate was etched to form a texture thereon. Thereafter, the substrate was rinsed twice with ultrapure water. The surface of the single-crystal substrate 1 was observed using an atomic force microscope (AFM, manufactured by Pacific Nanotechnology, Inc.) to confirm that the substrate surface was mostly etched, and a pyramidal textured surface exposed at the (111) plane was formed.

The single-crystal silicon substrate 1 after being etched was introduced into a CVD device, and on one surface of the substrate (incident surface side), a non-doped amorphous silicon thin-film layer was formed with a thickness of 4 nm as a first intrinsic silicon-based thin-film layer 41. Deposition conditions included a substrate temperature of 150° C., a pressure of 120 Pa, a $SiH_4/H_2$ flow ratio of 3/10 and a high-frequency power density of 0.011 W/cm$^2$.

After the non-doped amorphous silicon thin-film layer was formed with a thickness of 4 nm, plasma discharge was stopped temporarily, and supply of $SiH_4$ was stopped. Only hydrogen gas was introduced into the CVD device for about 30 seconds to replace the gas in the device. Thereafter, plasma discharge was resumed to carry out a hydrogen plasma treatment. Conditions for the hydrogen plasma treatment included a substrate temperature of 150° C., a pressure of 120 Pa, a high-frequency power density of 0.026 W/cm$^2$ and a treatment period of 60 seconds.

Thereafter, supply of $SiH_4$ was resumed, and a non-doped amorphous silicon thin-film layer was formed with a thickness of 6 nm as a second intrinsic silicon-based thin-film layer 42. Deposition conditions for forming the non-doped amorphous silicon thin-film 42 were the same as those for forming the non-doped amorphous silicon thin-film layer 41.

On the second non-doped intrinsic amorphous silicon-based thin-film layer 42, a p-type amorphous silicon layer 5 was formed with a thickness of 4 nm. Deposition conditions of the p-type amorphous silicon layer included a substrate temperature of 150° C., a pressure of 60 Pa, a $SiH_4$/diluted $B_2H_6$ gas flow ratio of 1/3 and a high-frequency power density of 0.011 W/cm$^2$. A diluted gas, wherein $B_2H_6$ concentration was diluted to 5000 ppm with H2, was used as the diluted $B_2H_6$ gas.

On the other surface (back side) of the single-crystal silicon substrate 1, a first non-doped amorphous silicon thin-film layer 21 was formed with a thickness of 4 nm, and a hydrogen plasma treatment was carried out, followed by forming a second non-doped amorphous silicon thin-film layer 22 having a thickness of 6 nm.

On the second non-doped intrinsic amorphous silicon-based thin-film layer 22, an n-type amorphous silicon layer 3 was formed with a thickness of 4 nm. Deposition conditions of the n-type amorphous silicon layer included a substrate temperature of 150° C., a pressure of 60 Pa, a $SiH_4$/diluted $PH_3$ gas flow ratio of 1/3 and a high-frequency power density of 0.011 W/cm$^2$. A diluted gas, wherein $PH_3$ concentration was diluted to 5000 ppm with $H_2$, was used as the diluted $PH_3$ gas.

Indium-tin complex oxide (ITO) was deposited with a thickness of 80 nm as transparent electrode layers 6 and 8 on the surfaces of the n-type amorphous silicon layer 3 and the p-type amorphous silicon layer 5, respectively. For the deposition of ITO, ITO target (containing 5% by weight of tin oxide) was used. Argon/oxygen was introduced at 50/1 sccm as a carrier gas, and deposition was carried out under conditions including a substrate temperature of 150° C., a pressure of 0.2 Pa and a high-frequency power density of 0.5 W/cm$^2$.

On the surfaces of the transparent electrode layers 6 and 8, a silver paste was screen-printed to form comb-like pattern electrodes as collecting electrodes 7 and 9, respectively. Finally, an annealing treatment was carried out at 150° C. for an hour to obtain a photoelectric conversion device.

Comparative Example 1

In Comparative Example 1, a crystalline silicon-based photoelectric conversion device was manufactured in the same manner as in Example 1, but each of the non-doped amorphous silicon layers 2 and 4 was formed with a thickness of 10 nm in one-time deposition. That is, Comparative Example 1 was different from Example 1 for the step described below.

On the back side of the single-crystal silicon substrate 1, the non-doped amorphous silicon layer 2 was formed with a thickness of 10 nm. Thereafter, the n-type amorphous silicon layer 3 was formed without carrying out the hydrogen plasma treatment and formation of the second non-doped amorphous silicon thin-film layer. On the front side of the single-crystal silicon substrate 1, similarly the non-doped amorphous silicon layer 4 was formed with a thickness of 10 nm, and the p-type amorphous silicon layer 5 was formed thereon.

Comparative Example 2

In Comparative Example 2, a crystalline silicon-based photoelectric conversion device was manufactured in the same manner as in Example 1, but each of the non-doped amorphous silicon layers 2 and 4 was formed with a thickness of 10 nm in one-time deposition after the hydrogen plasma treatment was applied directly onto the single-crystal silicon substrate 1. That is, Comparative Example 2 was different from Example 1 for the step described below.

The hydrogen plasma treatment was applied directly to the back side of the single-crystal silicon substrate 1 before the non-doped amorphous silicon layer 2 was formed. Conditions for the hydrogen plasma treatment were the same as those for the hydrogen plasma treatment in Example 1. Thereafter, the non-doped amorphous silicon layer 2 was formed with a thickness of 10 nm. Thereafter, the n-type amorphous silicon layer 3 was formed on the non-doped amorphous silicon layer 2 without carrying out the hydrogen plasma treatment and formation of the non-doped amorphous silicon-based thin-film. On the front side, in the same process, the single-crystal silicon substrate 1 was subjected to the hydrogen plasma treatment, the non-doped amorphous silicon layer 4 was thereafter formed with a thickness of 10 nm, and the p-type amorphous silicon layer 5 was formed thereon.

Comparative Example 3

In Comparative Example 3, a crystalline silicon-based photoelectric conversion device was manufactured in the same manner as in Example 1, but a non-doped amorphous silicon thin-film was formed under high hydrogen concentration conditions instead of carrying out the hydrogen plasma treatment between formation of the first intrinsic silicon-based thin-film layers 21 and 41 and formation of the second intrinsic silicon-based thin-film layers 22 and 42. That is, Comparative Example 3 was different from Example 1 in that the intrinsic silicon-based layers 2 and 4 were formed in the step described below.

In the same manner as in Example 1, a non-doped amorphous silicon thin-film layer was formed on one surface of the single-crystal silicon substrate 1 with a thickness of 4 nm as the first intrinsic silicon-based thin-film layer 41. Thereafter, the flow ratio of $SiH_4/H_2$ was changed to 3/75, and the high-frequency power density was changed to 0.026 W/cm² while plasma discharge was carried out, so that a non-doped amorphous silicon thin-film layer (interface layer) was formed with a thickness of 2 nm. Thereafter, the flow ratio of $SiH_4/H_2$ and the high-frequency power density were changed, and a non-doped amorphous silicon thin-film layer was formed with a thickness of 4 nm as the second intrinsic silicon-based thin-film layer 42. Conditions for forming the non-doped amorphous silicon thin-film layer 42 were the same as those for forming the non-doped amorphous silicon thin-film layer 41. On the other surface of the single-crystal silicon substrate 1, similarly the first non-doped amorphous silicon thin-film layer 21 with a thickness of 4 nm, the interface layer with a thickness of 2 nm and the non-doped amorphous silicon thin-film layer 22 with a thickness of 4 nm were sequentially formed.

Comparative Example 4

In Comparative Example 4, a crystalline silicon-based photoelectric conversion device having a first non-doped amorphous silicon thin-film layer, an interface layer and a second non-doped amorphous silicon thin-film layer as the intrinsic silicon-based layers 2 and 4 were manufactured in the same manner as in Comparative Example 3. However, Comparative Example 4 was different from Comparative Example 3 in that conditions for forming these layers were changed as described in (a) to (d) below:

(a) $H_2$ gas was not introduced, but only $SiH_4$ gas was introduced when the first non-doped amorphous silicon thin-film layer and the second non-doped amorphous silicon thin-film layer were formed;

(b) the flow ratio of $SiH_4/H_2$ during formation of the interface layer was changed to 3/30;

(c) the high-frequency power density during formation of the interface layer was changed to 0.011 W/cm²; and (d) the thickness of the interface layer was changed to 3 nm, and the thickness of the second non-doped amorphous silicon thin-film layer was changed to 3 nm.

The photoelectric conversion characteristics (open circuit voltage (Voc), short circuit current density (Jsc), fill factor (FF) and conversion efficiency (Eff)) of the photoelectric conversion devices obtained in Example 1 and Comparative Examples 1 to 4 described above were evaluated using a solar simulator. Evaluation results are shown in Table 1. Each photoelectric conversion characteristic in Table 1 is shown as a relative value with respect to Comparative Example 1.

TABLE 1

| | conversion characteristics | | | | |
|---|---|---|---|---|---|
| | Voc (relative value) | Jsc (relative value) | FF (relative value) | Eff (relative value) | carrier lifetime (μsec) |
| Example 1 | 1.063 | 1.006 | 1.019 | 1.089 | 1280 |
| Comparative Example 1 | 1 | 1 | 1 | 1 | 810 |
| Comparative Example 2 | 0.965 | 0.994 | 1.011 | 0.97 | 520 |
| Comparative Example 3 | 0.975 | 1.008 | 1.011 | 0.994 | N/A |
| Comparative Example 4 | 0.996 | 0.989 | 1.004 | 0.989 | N/A |

Example 1 and Comparative Examples 1 and 2 described above all have the same total thickness of the non-doped amorphous silicon layers 2 and 4. The photoelectric conversion device of Example 1, in which a hydrogen plasma treatment was carried out after formation of the first non-doped amorphous silicon thin-film layer, had improved conversion efficiency as compared to the photoelectric conversion device of Comparative Example 1 in which a hydrogen plasma treatment was not carried out, and the non-doped amorphous silicon layer 2 was formed in one-time deposition. The photoelectric conversion device of Comparative Example 2, in which a hydrogen plasma treatment was applied directly onto the single-crystal silicon substrate before formation of the non-doped amorphous silicon layer, had conversion efficiency lower than that of the photoelectric conversion device of Comparative Example 1.

Table 1 also shows the results of the carrier lifetime measurement for the photoelectric conversion devices of Examples 1 and Comparative Examples 1 and 2. The lifetime has a high correlation with the open circuit voltage (Voc). These differences are ascribable to the passivation effect on the single-crystal silicon substrate, i.e. a difference in density of defects at the interface between the single-crystal silicon substrate and the non-doped amorphous silicon layer. On the other hand, the short circuit current densities of Example 1 and Comparative Examples 1 and 2 fell within ±1%, and there was no significant difference. It is thus considered that there is no significant difference in film properties themselves, such as optical characteristics, of the non-doped amorphous silicon layer between Example 1 and Comparative Examples 1 and 2. From these results, it is considered that in the manufacturing method of the present invention, a reduction of defect density at the interface between the single-crystal silicon substrate and the intrinsic silicon-based layer from the hydrogen plasma treatment contributes to improve conversion efficiency.

On the other hand, in Comparative Example 2, in which a hydrogen plasma treatment is applied directly onto the single-crystal silicon substrate, the open circuit voltage decreases as compared to Comparative Example 1, even though the hydrogen plasma treatment is carried out. This is ascribable to the fact that a good interface state is not obtained due to impacts of plasma damage on the single-crystal silicon substrate surface. On the other hand, it is considered that when the hydrogen plasma treatment is carried out after formation of the first non-doped amorphous silicon thin-film layer as in Example 1, the first non-doped amorphous silicon thin-film layer acts as a protective layer, so that impacts of plasma damage are suppressed. Thus, it is considered that according to the manufacturing method of the present invention, impacts of plasma damage on the single-crystal silicon substrate are suppressed, and the hydrogen passivation effect is enhanced, so that defects at the interface are reduced.

A hydrogen atom concentration profile in the thickness direction of the non-doped amorphous silicon layer was measured by secondary-ion mass spectrometry (SIMS). No characteristic profile was observed in any of the samples of Example 1 and Comparative Examples 1 and 2. It is thus apparent that in the photoelectric conversion device of Example 1, an interface layer having a significant thickness is not formed between the first non-doped amorphous silicon thin-film layer and the second non-doped amorphous silicon thin-film layer. Accordingly, it can be said that deposition is substantially stopped in the hydrogen plasma treatment step of Example 1.

On the other hand, in Comparative Example 3, in which an interface layer is formed between the first non-doped amorphous silicon thin-film layer and the second non-doped amorphous silicon thin-film layer under high hydrogen conditions, enhancement of conversion efficiency as in Example 1 was not observed, and rather conversion efficiency was degraded as compared to Comparative Example 1. Comparative Example 4 showed the same tendency as in Comparative Example 3. Since the high-frequency power density during formation of the interface layer in Comparative Example 3 is identical to that in the hydrogen plasma treatment step in Example 1, it is considered that in Example 1, the plasma treatment step being carried out under a hydrogen gas atmosphere, containing substantially no raw material gas, contributes to improve conversion efficiency.

Examples 2 to 6 and Comparative Examples 5 and 6

A photoelectric conversion device was prepared in the same manner as in Example 1 except that the thickness of each of the first non-doped amorphous silicon thin-film layers 21 and 41 were changed as shown in Table 2. The photoelectric conversion characteristics of the photoelectric conversion devices of these Examples and Comparative Examples are shown in Table 2, along with the photoelectric conversion characteristic of the photoelectric conversion device of Example 1. Each photoelectric conversion characteristic in Table 2 is shown as a relative value with respect to Comparative Example 1 described above.

TABLE 2

| | Thickness | | | conversion characteristics | | | |
|---|---|---|---|---|---|---|---|
| | first layer (nm) | second layer (nm) | total (nm) | Voc (relative value) | Jsc (relative value) | FF (relative value) | Eff (relative value) |
| Example 2 | 2 | 6 | 8 | 1.035 | 1.009 | 1.039 | 1.085 |
| Example 3 | 3 | 6 | 9 | 1.053 | 1.013 | 1.028 | 1.096 |
| Example 1 | 4 | 6 | 10 | 1.063 | 1.006 | 1.019 | 1.089 |
| Example 4 | 6 | 6 | 12 | 1.058 | 0.990 | 0.983 | 1.030 |
| Example 5 | 8 | 6 | 14 | 1.055 | 0.998 | 0.979 | 1.031 |
| Example 6 | 10 | 6 | 16 | 1.039 | 0.992 | 0.976 | 1.006 |
| Comparative Example 5 | 12 | 6 | 18 | 1.038 | 0.986 | 0.972 | 0.995 |
| Comparative Example 6 | 14 | 6 | 20 | 1.023 | 0.984 | 0.963 | 0.970 |

According to Table 2, there is a tendency that the open circuit voltage is temporarily increased as the thickness increases in a region where the thickness of the first non-doped amorphous silicon thin-film layer is 4 nm or less, and the open circuit voltage is reduced when the thickness is 6 nm or more. The increase of the open circuit voltage with an increase in thickness of the first non-doped amorphous silicon thin-film layer (first intrinsic silicon-based thin-film layer) is ascribable to the role of the first intrinsic silicon-based thin-film layer as a protective layer that reduces impacts of plasma damage on the single-crystal silicon substrate surface. On the other hand, it is considered that the passivation effect and the interface defect reducing effect from the hydrogen plasma treatment is blocked as the thickness of the first intrinsic silicon-based thin-film layer increases, and the open circuit voltage is thus reduced, as demonstrated in Table 2, when the thickness of the first intrinsic silicon-based thin-film layer is 6 nm or more. From the results described above, it can be said that the thickness of the first non-doped amorphous silicon thin-film layer is particularly preferably in a range of 2 nm to 5 nm, most preferably in a range of 2 to 4 nm.

Examples 7 to 11

A photoelectric conversion device was prepared in the same manner as in Example 1 except that the thickness of each of the second non-doped amorphous silicon thin-film layers 22 and 42 were changed as shown in Table 3.

Comparative Example 7

As in Example 1, the first non-doped amorphous silicon thin-film layers 21 and 41 were each formed with a thickness of 4 nm, followed by carrying out a hydrogen plasma treatment. Thereafter, the n-type amorphous silicon layer 3 and the p-type amorphous silicon layer 5 were formed without forming the second non-doped amorphous silicon thin-film layers 22 and 42. A photoelectric conversion device was prepared otherwise in the same manner as in Example 1.

The photoelectric conversion characteristics of the photoelectric conversion devices of Examples 7 to 11 and Comparative Example 7 are shown in Table 3 along with the photoelectric conversion characteristic of the photoelectric conversion device of Example 1. Each photoelectric conversion characteristic in Table 3 is shown as a relative value with respect to Comparative Example 1 described above.

TABLE 3

|  | thickness | | | conversion characteristics | | | |
| --- | --- | --- | --- | --- | --- | --- | --- |
|  | first layer (nm) | second layer (nm) | Total (nm) | Voc (relative value) | Jsc (relative value) | FF (relative value) | Eff (relative value) |
| Comparative Example 7 | 4 | 0 | 4 | 0.978 | 1.014 | 1.008 | 1.000 |
| Example 7 | 4 | 2 | 6 | 1.022 | 1.013 | 1.015 | 1.050 |
| Example 8 | 4 | 4 | 8 | 1.032 | 1.013 | 1.023 | 1.069 |
| Example 1 | 4 | 6 | 10 | 1.063 | 1.006 | 1.019 | 1.089 |
| Example 9 | 4 | 8 | 12 | 1.051 | 0.998 | 1.014 | 1.063 |
| Example 10 | 4 | 10 | 14 | 1.050 | 0.995 | 1.000 | 1.045 |
| Example 11 | 4 | 12 | 16 | 1.048 | 0.986 | 0.979 | 1.011 |

In Comparative Example 7, in which the second non-doped amorphous silicon thin-film layer (second intrinsic silicon-based thin-film layer) was not formed, the photoelectric conversion characteristic, particularly the open circuit voltage, was reduced as compared to Examples. This is considered to be because the thickness of the intrinsic silicon-based layer is small, and thus cause dope impurity atoms diffusion or the like during formation of a conductive silicon-based layer thereon.

According to Table 3, on the other hand, there is a tendency that when the total thickness of the first intrinsic silicon-based thin-film layer and the second intrinsic silicon-based thin-film layer (i.e. thickness of intrinsic silicon-based layer) increases as the thickness of the latter layer increases, the short circuit current and the fill factor are reduced. There is the same tendency in comparison of Examples and Comparative Examples in Table 2. The reduction in short circuit current is ascribable to the light absorption being increased due to an increase in thickness of the intrinsic silicon-based layer. The reduction in fill factor is ascribable to an increase in resistance of the intrinsic silicon-based layer in the thickness direction. From these results, it can be said that the thickness of the second intrinsic silicon-based thin-film layer is preferably set in consideration of the total thickness of the first intrinsic silicon-based thin-film layer and the second intrinsic silicon-based thin-film layer so that the short circuit current and the fill factor are not excessively reduced.

Examples 12 to 19

A photoelectric conversion device was prepared in the same manner as in Example 1 except that the high-frequency power density and the treatment period of the hydrogen plasma treatment step were changed as shown in Table 4. The photoelectric conversion characteristics of the photoelectric conversion devices of these Examples are shown in Table 4 along with the photoelectric conversion characteristic of the photoelectric conversion device of Example 1. Each photoelectric conversion characteristic in Table 4 is shown as a relative value with respect to Comparative Example 1 described above.

TABLE 4

|  | hydrogen plasma treatment | | conversion characteristics | | | |
| --- | --- | --- | --- | --- | --- | --- |
|  | power density (mW/cm$^2$) | period (second) | Voc (relative value) | Jsc (relative value) | FF (relative value) | Eff (relative value) |
| Example 12 | 0.026 | 10 | 1.031 | 1.006 | 1.004 | 1.041 |
| Example 13 | 0.026 | 30 | 1.064 | 1.003 | 1.011 | 1.079 |
| Example 1 | 0.026 | 60 | 1.063 | 1.006 | 1.019 | 1.089 |
| Example 14 | 0.026 | 90 | 1.039 | 1.008 | 1.001 | 1.049 |
| Example 15 | 0.026 | 120 | 1.033 | 1.002 | 0.995 | 1.03 |
| Example 16 | 0.026 | 140 | 1.018 | 0.996 | 0.998 | 1.002 |
| Example 17 | 0.016 | 60 | 1.022 | 1.008 | 1.007 | 1.037 |
| Example 18 | 0.039 | 60 | 1.029 | 1.006 | 1.009 | 1.041 |
| Example 19 | 0.052 | 60 | 1.016 | 1.003 | 0.988 | 1.007 |

According to Table 4, principally the open circuit voltage is changed as a result of changing the high-frequency power density and the plasma treatment period in the hydrogen plasma treatment step. This is considered to be because if the high-frequency power density is low or the plasma treatment period is short, hydrogen passivation and defect reducing effects from the hydrogen plasma treatment are low, leading to less enhancement of the open circuit voltage. It is considered that if conversely the high-frequency power density is excessively high or the plasma treatment period is excessively long, impacts of plasma damage on the single-crystal silicon surface become so significant that the open circuit voltage enhancing effect due to passivation and reduction of interface defects is canceled out.

Example 20

In Example 20, a crystalline silicon-based photoelectric conversion device was manufactured in the same manner as in Example 1, but this Example was different from Example 1 in that the first non-doped amorphous silicon thin-film layers 21 and 41 each having a thickness of 2 nm were formed, and the hydrogen plasma treatment was carried out, followed by forming the second non-doped amorphous silicon thin-film layers 22 and 42 each having a thickness of 8 nm.

Reference Example 1

In Reference Example 1, a crystalline silicon-based photoelectric conversion device was manufactured in the same manner as in Example 20, but this Reference Example was different from Example 20 in that deposition of a non-doped amorphous silicon thin-film layer and a hydrogen plasma treatment were repeatedly carried out in the formation of non-doped amorphous silicon layers 2 and 4. In specific, in Reference Example 1, the non-doped amorphous silicon thin-film layer was formed with a thickness of 2 nm, and thereafter the hydrogen plasma treatment was carried out, followed by further formation of a non-doped amorphous silicon thin-film layer having a thickness of 2 nm and a hydrogen plasma treatment. An amorphous silicon layer having a thickness of 4 nm was further formed thereon. On the non-doped amorphous silicon layers 2 and 4, the n-type amorphous silicon layer 3 and the p-type amorphous silicon layer 5 were formed, respectively.

Reference Example 2

In Reference Example 2, formation of a non-doped amorphous silicon thin-film layer and a hydrogen plasma treatment were repeatedly carried out in the same manner as in Reference Example 1. Reference Example 2 was different from Reference Example 1 in that deposition of a non-doped amorphous silicon thin-film layer having a thickness of 2 nm and a hydrogen plasma treatment were repeatedly carried out three times, followed by forming thereon an amorphous silicon layer having a thickness of 2 nm.

The photoelectric conversion characteristic and the total time required for forming the non-doped amorphous silicon layers 2 and 4 (including the plasma treatment period) for the photoelectric conversion devices of Example 20 and Reference Examples 1 and 2 are shown in Table 5. Each photoelectric conversion characteristics and time in Table 5 are shown as a relative value with respect to Example 20.

TABLE 5

| | conversion characteristics | | | | |
|---|---|---|---|---|---|
| | Voc (relative value) | Jsc (relative value) | FF (relative value) | Eff (relative value) | deposition period (relative value) |
| Example 20 | 1 | 1 | 1 | 1 | 1 |
| Reference Example 1 | 1.008 | 0.996 | 0.999 | 1.003 | 1.5 |
| Reference Example 2 | 0.998 | 1.000 | 1.000 | 0.998 | 2 |

There is no distinctive difference in photoelectric characteristic between Example 16 and Reference Examples 1 and 2, and an effect of improvement by repeatedly carrying out formation of the non-doped amorphous silicon thin-film layer and the hydrogen plasma treatment was not observed. It is thus considered that improvement in the photoelectric conversion characteristics according to the manufacturing method of the present invention do not result from improvement of film quality by chemical annealing, but results from the passivation effect on the single-crystal silicon substrate surface from the hydrogen plasma treatment and the effect of reducing defects at the interface between the single-crystal silicon substrate and the intrinsic silicon-based layer.

On the other hand, in Reference Examples 1 and 2 in which deposition of the intrinsic silicon-based thin-film layer and the hydrogen plasma treatment are repeatedly carried out, the deposition time is increased. From the results described above, it can be said that in the present invention, formation of the intrinsic silicon-based thin-film layer and the hydrogen plasma treatment can be repeatedly carried out, but it is preferable, from the viewpoint of productivity, to carry out formation of the first intrinsic silicon-based thin-film layer and the hydrogen plasma treatment only once, followed by forming the second intrinsic silicon-based thin-film layer.

Description of Reference Characters

1 single-crystal silicon substrate of the first conductivity type (n-type)
2 intrinsic silicon-based layer of the first conductivity type (n-type) layer-side
4 intrinsic silicon-based layer of the opposite conductivity type (p-type) layer-side
21, 41 first intrinsic silicon-based thin-film layer
22, 42 second intrinsic silicon-based thin-film layer
3 silicon-based thin-film layer of the first conductivity type (n-type)
5 silicon-based thin-film layer of the opposite conductivity type (p-type)
6, 8 transparent electrode layer
7, 9 collecting electrode

The invention claimed is:

1. A method for manufacturing a crystalline silicon-based photoelectric conversion device, wherein the crystalline silicon-based photoelectric conversion device comprises: an intrinsic silicon-based layer of a first conductivity type layer-side and a silicon-based layer of a first conductivity type, in this order on one surface of a single-crystal silicon substrate of the first conductivity type; and an intrinsic silicon-based layer of an opposite conductivity type layer-side and a silicon-based layer of an opposite conductivity type, in this order on another surface of the single-crystal silicon substrate of the first conductivity type, the method comprising:
at least one of a step of forming the intrinsic silicon-based layer of the first conductivity type layer-side and a step of forming the intrinsic silicon-based layer of the opposite conductivity type layer-side, the at least one step including sub-steps in the following order:
a step of forming a first intrinsic silicon-based thin-film layer having a thickness of 1 nm to 10 nm on the single-crystal silicon substrate of the first conductivity type;
a step of plasma-treating the single-crystal silicon substrate of the first conductivity type, on which the first intrinsic silicon-based thin-film layer is formed thereon, in an atmosphere of a gas containing hydrogen as a main component; and
a step of forming a second intrinsic silicon-based thin-film layer on the first intrinsic silicon-based thin-film layer.

2. The method for manufacturing a crystalline silicon-based photoelectric conversion device according to claim 1, wherein a sum of thicknesses of the first intrinsic silicon-based thin-film layer and the second intrinsic silicon-based thin-film layer is 16 nm or less.

3. The method for manufacturing a crystalline silicon-based photoelectric conversion device according to claim 1, wherein a plasma discharge is temporarily stopped after the step of forming the first intrinsic silicon-based thin-film layer, and the plasma discharge is resumed thereafter to carry out the plasma treatment step.

4. The method for manufacturing a crystalline silicon-based photoelectric conversion device according to claim 2, wherein a plasma discharge is temporarily stopped after the step of forming the first intrinsic silicon-based thin-film layer, and the plasma discharge is resumed thereafter to carry out the plasma treatment step.

* * * * *